(12) United States Patent
Ahn et al.

(10) Patent No.: US 11,277,019 B2
(45) Date of Patent: Mar. 15, 2022

(54) ENERGY HARVESTING APPARATUS, SYSTEM, AND METHOD FOR ESTIMATING AMBIENT ENERGY INTENSITY

(71) Applicant: KOREA ELECTRONICS TECHNOLOGY INSTITUTE, Seongnam-si (KR)

(72) Inventors: Hyunseuk Ahn, Seongnam-si (KR); Younghan Kim, Seoul (KR); Changseok Yun, Gyeonggi-do (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 8 days.

(21) Appl. No.: 16/665,051

(22) Filed: Oct. 28, 2019

(65) Prior Publication Data

US 2020/0185946 A1 Jun. 11, 2020

(30) Foreign Application Priority Data

Dec. 10, 2018 (KR) .................. 10-2018-0158321
Oct. 4, 2019 (KR) .................. 10-2019-0122754

(51) Int. Cl.
*H02J 7/00* (2006.01)
*H02J 7/34* (2006.01)
(Continued)

(52) U.S. Cl.
CPC ........ *H02J 7/0068* (2013.01); *G01R 29/0892* (2013.01); *G01R 31/2822* (2013.01);
(Continued)

(58) Field of Classification Search
CPC ........ H02J 7/0068; H02J 50/001; H02J 50/20; H02J 7/345; H02J 7/34; H02J 3/383;
(Continued)

(56) References Cited

U.S. PATENT DOCUMENTS

2010/0013310 A1* 1/2010 Day ..................... F03D 9/25
307/64
2012/0133213 A1* 5/2012 Borke ................... H02J 50/12
307/104
(Continued)

FOREIGN PATENT DOCUMENTS

KR 10-2010-0130627 A 12/2010
KR 10-2011-0010104 A 1/2011
(Continued)

OTHER PUBLICATIONS

Korean Office Action dated Feb. 11, 2020, in connection with corresponding Korean Patent Application No. 10-2019-0122754, citing the above references.
(Continued)

*Primary Examiner* — John W Poos
*Assistant Examiner* — Alex W Lam
(74) *Attorney, Agent, or Firm* — Hauptman Ham, LLP (57) ABSTRACT

An energy harvesting apparatus, system, and method are provided to perform energy harvesting and estimation of ambient energy intensity. The energy harvesting apparatus includes an energy converter, an energy storage, an output voltage/current detector, and a switch. The energy converter receives ambient energy, converts the ambient energy into DC power having a DC voltage and a DC current, and outputs the DC power. The energy storage receives and stores the DC power. The output voltage/current detector has a constant load value and detects at least one of the DC voltage and the DC current, outputted from the energy converter, to be used for estimating intensity of the ambient energy. The switch selectively connects the energy converter to the energy storage or the output voltage/current detector.

5 Claims, 6 Drawing Sheets

(51) Int. Cl.
    *G01R 29/08*         (2006.01)
    *G01R 31/28*         (2006.01)
    *H02J 50/00*         (2016.01)
    *H02J 50/20*         (2016.01)

(52) U.S. Cl.
    CPC ............ *H02J 50/001* (2020.01); *H02J 50/20* (2016.02); *H02J 7/345* (2013.01)

(58) Field of Classification Search
    CPC ..... H02J 3/32; H02J 3/381; H02J 3/38; G01R 31/2822; G01R 29/0892; H02M 3/33584
    See application file for complete search history.

(56) References Cited

U.S. PATENT DOCUMENTS

2017/0170675 A1\*   6/2017   Ni Scanaill ............... H02J 7/34
2018/0337551 A1\*  11/2018   Park ........................ H02S 10/40

FOREIGN PATENT DOCUMENTS

| KR | 10-2015-0046713 A | 4/2015 |
|----|-------------------|--------|
| KR | 10-1814556 B1     | 12/2017 |
| KR | 10-2019-0015231 A | 2/2019 |

OTHER PUBLICATIONS

Korean Notice of Allowance dated Jun. 4, 2020, in connection with corresponding Korean Patent Application No. 10-2019-0122754, citing the above references.

\* cited by examiner

ENERGY HARVESTING APPARATUS, SYSTEM, AND METHOD FOR ESTIMATING AMBIENT ENERGY INTENSITY

TECHNICAL FIELD

The present disclosure relates to energy harvesting and, more particularly, to an energy harvesting apparatus, system, and method for harvesting ambient energy and estimating the intensity of the ambient energy.

BACKGROUND

With the growths of Internet of Things (IoT) technologies in a great variety of fields, it is expected that the use of very compact IoT devices of ultra-low-power will increase explosively. However, because such IoT devices need to receive power through a battery or wired power connection to operate, they confront limitations in usable environments and occurrence of maintenance costs. This is a serious obstacle to the proliferation of IoT devices.

In order to solve this issue, what is called a disposable IoT device has been recently introduced. This type IoT device is implemented with very low cost as well as ultra-low power, thus not only performing a default function with limited communication speed but also offering the convenience of easy use and discard.

In addition, to solve a problem caused by the limited battery capacity of IoT devices, there is a demand for the power system technology of IoT devices incorporating the energy harvesting technique that can improve power regeneration and survivability through ambient energy collection and conversion.

SUMMARY

Accordingly, the present disclosure provides an energy harvesting apparatus, system, and method for harvesting ambient energy and estimating the intensity of the ambient energy.

According to embodiments of the present disclosure, an energy harvesting apparatus may include an energy converter receiving ambient energy, converting the ambient energy into DC power having a DC voltage and a DC current, and outputting the DC power; an energy storage receiving and storing the DC power; an output voltage/current detector having a constant load value and detecting at least one of the DC voltage and the DC current, outputted from the energy converter, to be used for estimating intensity of the ambient energy; and a switch selectively connecting the energy converter to the energy storage or the output voltage/current detector.

The DC voltage and the DC current, detected based on the constant load value, may be proportional to the intensity of the ambient energy.

The output voltage/current detector may include at least one of a passive device and an active device.

The energy converter may be an RF-to-DC converter when the ambient energy is radio frequency (RF) energy.

The energy storage may include at least one of a secondary battery and a super capacitor.

The energy harvesting apparatus may further include a DC regulator interposed between the switch and the energy storage, and converting the DC voltage, outputted from the energy converter, into a DC voltage to be usable in a load.

The energy harvesting apparatus may further include a controller controlling the switch and, when the energy converter is connected to the output voltage/current detector through the switch, receiving at least one of the detected DC voltage and the detected DC current from the output voltage/current detector and estimating the intensity of the ambient energy from at least one of the received DC voltage and the received DC current.

The controller may control the switch to connect the energy converter to the energy storage in case of energy harvesting and control the switch to connect the energy converter to the output voltage/current detector in case of estimation of the ambient energy intensity.

The controller may perform the estimation of the ambient energy intensity periodically or aperiodically.

According to embodiments of the present disclosure, a method for estimating ambient energy intensity, performed by an energy harvesting apparatus, may include enabling an energy converter to receive ambient energy, convert the ambient energy into DC power having a DC voltage and a DC current, and output the DC power; in case of energy harvesting, connecting the energy converter to an energy storage through a switch and storing the DC power outputted from the energy converter in the energy storage; in case of estimation of the ambient energy intensity, connecting the energy converter to an output voltage/current detector having a constant load value through the switch and detecting at least one of the DC voltage and the DC current, outputted from the energy converter, through output voltage/current detector; and estimating the intensity of the ambient energy from at least one of the detected DC voltage and the detected DC current.

According to embodiments of the present disclosure, a method for estimating ambient energy intensity, performed by a load in an energy harvesting system that includes the load and an energy harvesting apparatus composed of an energy converter, a switch, an energy storage, and an output voltage/current detector having a constant load value, may include controlling the switch to connect the energy converter to the energy storage such that DC power outputted from the energy converter is stored in the energy storage; controlling the switch to connect the energy converter to the output voltage/current detector such that the output voltage/current detector detects at least one of a DC voltage and a DC current outputted from the energy converter; receiving at least one of the detected DC voltage and the detected DC current from the output voltage/current detector; and estimating the intensity of the ambient energy from at least one of the received DC voltage and the received DC current.

According to embodiments of the present disclosure, an energy harvesting system may include an energy harvesting apparatus collecting ambient energy, generating DC power from the ambient energy, and detecting at least one of a DC voltage and a DC current of the DC power; and a load operating by receiving the DC power from the energy harvesting apparatus.

In the energy harvesting system, the energy harvesting apparatus may include an energy converter receiving the ambient energy, converting the ambient energy into the DC power having the DC voltage and the DC current, and outputting the DC power; an energy storage receiving and storing the DC power; an output voltage/current detector having a constant load value and detecting at least one of the DC voltage and the DC current, outputted from the energy converter, to be used for estimating intensity of the ambient energy; and a switch selectively connecting the energy converter to the energy storage or the output voltage/current detector.

The energy harvesting apparatus may further include a controller controlling the switch and, when the energy converter is connected to the output voltage/current detector through the switch, receiving at least one of the detected DC voltage and the detected DC current from the output voltage/current detector and estimating the intensity of the ambient energy from at least one of the received DC voltage and the received DC current.

The energy harvesting apparatus may further include a DC regulator interposed between the switch and the energy storage, and converting the DC voltage, outputted from the energy converter, into a DC voltage to be usable in a load.

The load may control the switch to connect the energy converter to the output voltage/current detector, receive at least one of the detected DC voltage and the detected DC current from the output voltage/current detector, and estimate the intensity of the ambient energy from at least one of the received DC voltage and the received DC current.

The load may include an Internet of Things (IoT) device.

According to embodiments, the energy harvesting apparatus is capable of estimating the intensity of the ambient energy as well as performing the energy harvesting by collecting the ambient energy. Therefore, without requiring an additional sensor for monitoring the ambient energy, it is possible to simply provide information about the intensity of the ambient energy that can be collected from surroundings.

In addition, the energy harvesting apparatus according to embodiments can detect, using the output voltage/current detector having a constant load value, the DC voltage outputted from the energy converter and then estimate, using the controller, the intensity of the ambient energy from the detected DC voltage. Because the output DC voltage detected on the basis of the constant load value has a property that is proportional to the intensity of the ambient energy inputted to the energy converter, using this property allows the simple estimation of the ambient energy intensity without any additional sensor for the ambient energy monitoring.

DETAILED DESCRIPTION

Hereinafter, embodiments of the present disclosure will be described in detail with reference to the accompanying drawings. The present disclosure may, however, be embodied in many different forms and should not be construed as being limited to the embodiments set forth herein. Rather, these embodiments are provided so that the disclosure will be thorough and complete and will fully convey the scope of the disclosure to those skilled in the art.

In the following description of embodiments, techniques that are well known in the art and not directly related to the present disclosure are not described. This is to clearly convey the subject matter of the present disclosure by omitting an unnecessary explanation. For the same reason, some elements in the drawings are exaggerated, omitted, or schematically illustrated. Also, the size of each element does not entirely reflect the actual size. In the disclosure, the same or corresponding elements are denoted by the same reference numerals.

First Embodiment

Figure 1:
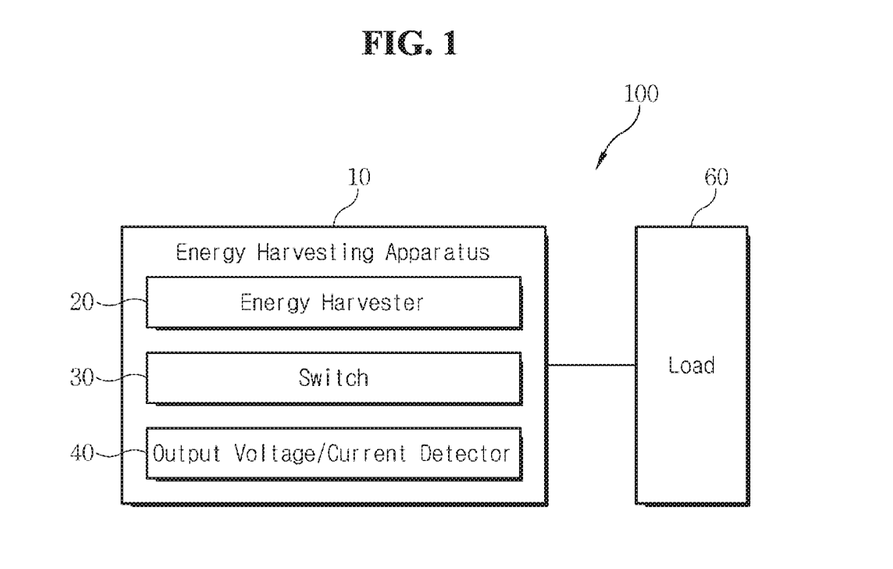
FIG. 1 is a block diagram illustrating an energy harvesting system for estimating ambient energy intensity according to a first embodiment of the present disclosure.

FIG. 1 is a block diagram illustrating an energy harvesting system for estimating ambient energy intensity according to a first embodiment of the present disclosure.

Referring to FIG. 1, an energy harvesting system 100 according to the first embodiment includes an energy harvesting apparatus 10 and a load 60. The energy harvesting apparatus 10 collects ambient energy, generates DC power, detects at least one of a DC voltage and a DC current of the DC power, and estimates the intensity of the ambient energy. The load 60 operates by receiving the DC power from the energy harvesting apparatus 10.

The energy harvesting apparatus 10 not only harvests the ambient energy, but also estimates the intensity of the ambient energy. To this end, the energy harvesting apparatus 10 includes an energy harvester 20, a switch 30, and an output voltage/current detector 40. The energy harvester 20 collects the ambient energy, thereby generates DC power, and stores the generated DC power. In addition, the energy harvester 20 supplies required DC power to the load 60. The output voltage/current detector 40 has a constant load value and detects at least one of a DC voltage and a DC current of the DC power, generated by the energy harvester 20, to be used for estimating the intensity of the ambient energy inputted to the energy harvester 20. The switch 30 switches between the energy harvesting and the estimation of the ambient energy intensity.

The load 60 refers to various electronic devices such as IoT devices and/or sensors to be actually operated. The IoT devices and/or sensors may be applied to various fields such as, for example, industrial/home IoT sensors, beacons, smart tags, rental bicycle anti-theft services, medical services, environmental monitoring services, building management services, agro-livestock management services, logistics services, medical patient management services, and remote environment monitoring services.

Figure 2:
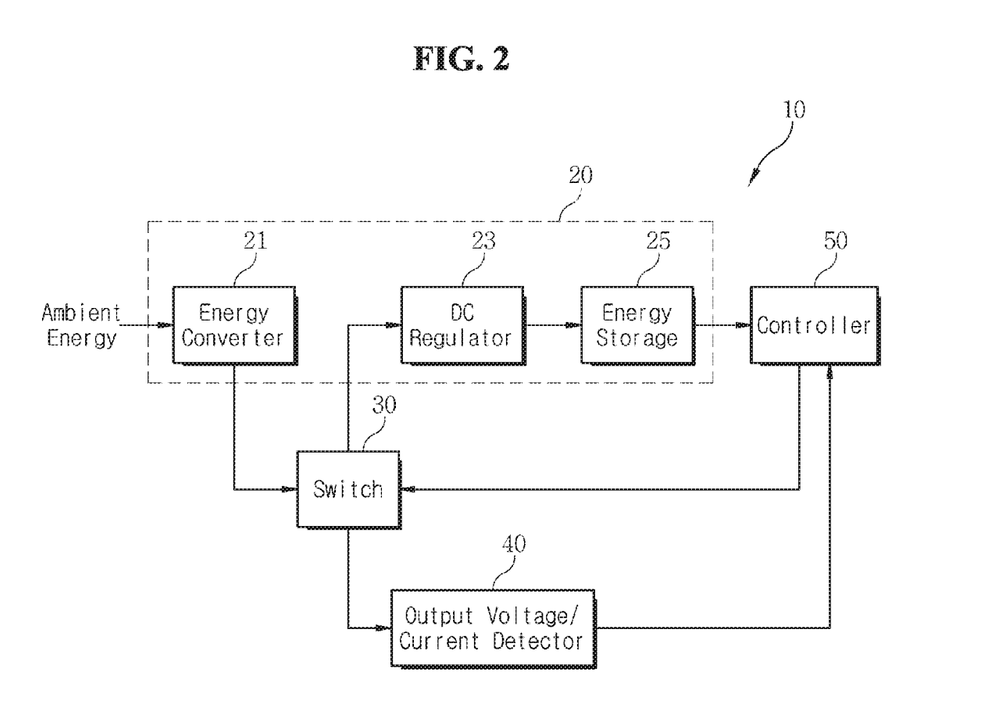
FIG. 2 is a block diagram illustrating the energy harvesting apparatus of FIG. 1.
Figure 3:
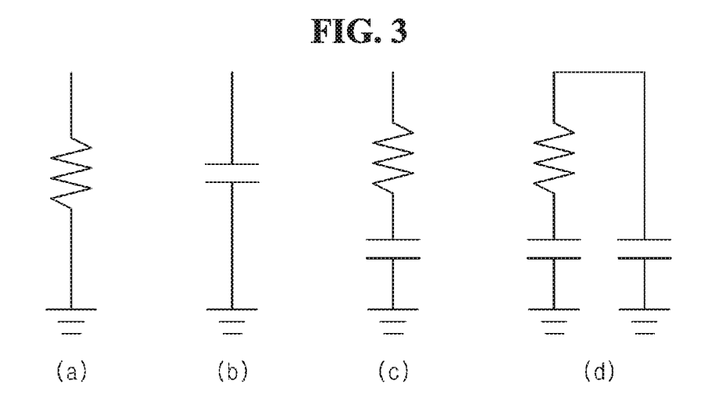
FIG. 3 is a circuit diagram illustrating the output voltage/current detector of FIG. 2.
Figure 4:
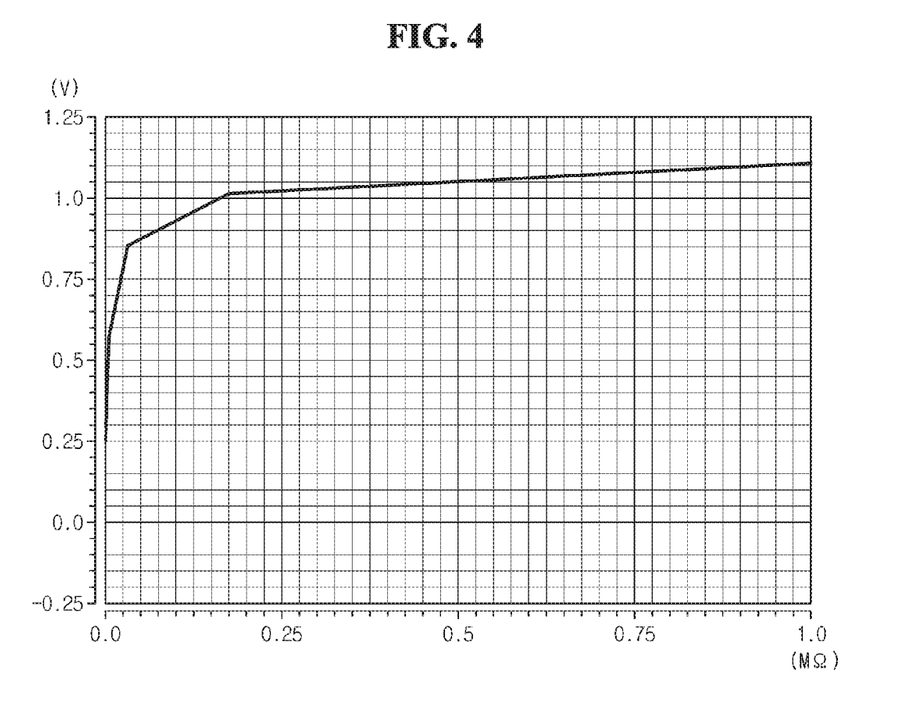
FIG. 4 is a graph showing a change in output voltage according to a change in output load value under the same input power condition.
Figure 5:
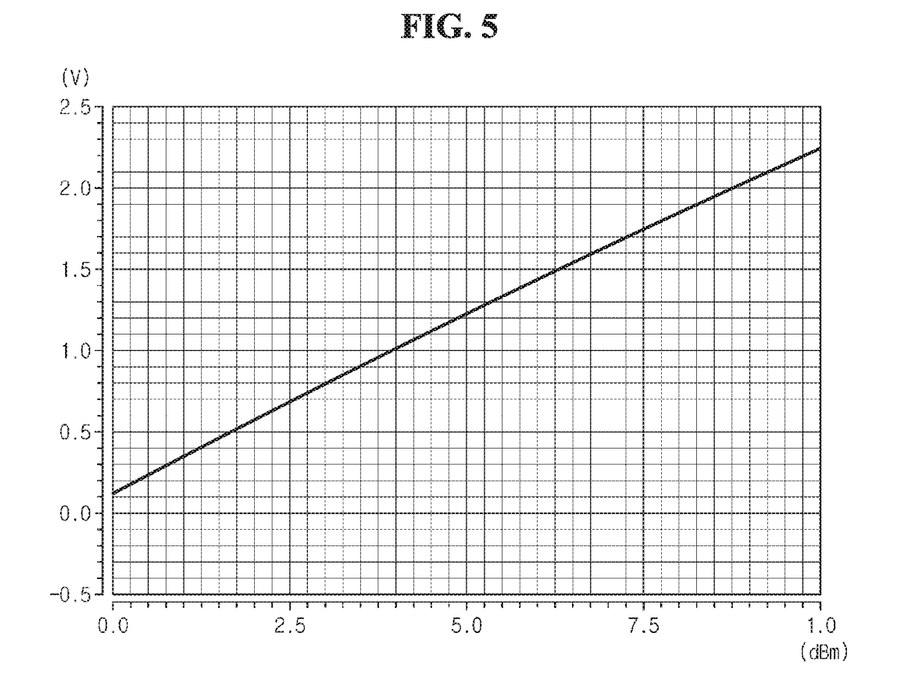
FIG. 5 is a graph showing a change in output voltage according to a change in input power under a constant load value condition.

Now, the energy harvesting apparatus 10 according to the first embodiment will be described in detail with reference to FIGS. 1 to 5. FIG. 2 is a block diagram that illustrates the energy harvesting apparatus 10 of FIG. 1. FIG. 3 is a circuit diagram that illustrates the output voltage/current detector 40 of FIG. 2. FIG. 4 is a graph that shows a change in output voltage according to a change in output load value under the same input power condition. FIG. 5 is a graph that shows a change in output voltage according to a change in input power under a constant load value condition.

The energy harvesting apparatus 10 according to the first embodiment includes the energy harvester 20, the switch 30, and the output voltage/current detector 40. The energy harvester 20 includes an energy converter 21 and an energy storage 25. The energy converter 21 receives ambient energy, converts the ambient energy into DC power having a DC voltage and a DC current, and outputs the DC power. The energy storage 25 receives and stores the DC power. The output voltage/current detector 40 has a constant load value and detects at least one of the DC voltage and the DC current, outputted from the energy converter 21, to be used for estimating the intensity of the ambient energy. The switch 30 selectively connects the energy converter 21 to the energy storage 25 or the output voltage/current detector 40. The energy harvester 20 may further include a DC regulator 23. The energy harvesting apparatus 10 may further include a controller 50.

The energy converter 21 is a converting device that receives the ambient energy and converts it into the DC power. In this disclosure, the ambient energy refers to various kinds of energy that can be easily obtained from ambient environments. For example, the ambient energy includes solar energy, radio frequency (RF) energy, piezoelectric energy, friction force energy, and the like. If the ambient energy is the RF energy, the energy converter 21 may be an RF-to-DC converter.

The switch 30 is a switching device that selectively connects the energy converter 21 to one of the energy storage 25 and the output voltage/current detector 40 under the control of the controller 50. When the energy harvesting is performed, the switch 30 connects the energy converter 21 to the energy storage 25. When the estimation of the ambient energy intensity is performed, the switch 30 connects the energy converter 21 to the output voltage/current detector 40.

The energy storage 25 is a storing device that stores the DC power received from the energy converter 21. The energy storage 25 supplies required power to the load 60 under the control of the controller 50. The energy storage 25 includes, for example, at least one of a secondary battery and a super capacitor.

The DC regulator 23 is interposed between the switch 30 and the energy storage 25. The DC regulator 23 converts the DC voltage, outputted from the energy converter 21, into a DC voltage to be usable in the load 60, and then delivers the usable DC voltage to the energy storage 25. The energy storage 25 stores the DC power passed through the DC regulator 23.

The output voltage/current detector 40 detects at least one of the DC voltage and the DC current outputted from the energy converter 21. Because the output voltage/current detector 40 has a constant load value, the energy converter 21 outputs the DC voltage and the DC current which are proportional to the intensity of the ambient energy inputted to the energy converter 21. The output voltage/current detector 40 is connected to an output terminal of the energy converter 21 and detects at least one of the DC voltage and the DC current outputted from the energy converter 21.

The output voltage/current detector 40 may be implemented using a passive device or an active device, which has a constant load value. Considering relatively low power consumption of the passive device compared to the active device, the output voltage/current detector 40 may be composed of the passive device. FIG. 3 shows an example in which the output voltage/current detector 40 is implemented with the passive device including at least one of a resistor and a capacitor. For example, when the output voltage/current detector 40 is composed of a resistor as indicated by (a) in FIG. 3, the constant load value may be 10 k$\Omega$ or more, preferably, between 10 k$\Omega$ and 10 M$\Omega$.

The reason for detecting the output DC voltage of the energy converter 21 with the output voltage/current detector 40 having the constant load value will be now described with reference to FIGS. 3 to 5.

If the energy converter 21 outputs, regardless of a change in the output load value, a DC voltage in proportion to the intensity of the ambient energy inputted, the intensity of the input ambient energy can be estimated from the output DC voltage of the energy converter 21.

That is, if the energy converter 21 outputs a constant DC voltage with respect to the same intensity of the ambient energy regardless of a change of the output load value, it is possible to estimate the intensity of the input ambient energy on the basis of the output DC voltage of the energy converter 21.

However, when the output load value changes with respect to the same input power (energy), the output DC voltage also changes as shown in FIG. 4. Therefore, the energy converter 21 cannot estimate the intensity of the input power from the output DC voltage. In FIG. 4, the horizontal axis represents the output load value (M$\Omega$), and the vertical axis represents the output DC voltage (V).

In general, the load 60 including the IoT device has a load value that changes according to operating situations. This change in the load value depending on operating situations is unpredictable in a power system for supplying power. The power system may be configured to merely supply the maximum output power required by the load 60. Because the energy harvesting system 100 generates power using the ambient energy, the possibility and efficiency of energy harvesting are determined according to the situation of the ambient energy and the output load situation of the load 60. Depending on the output load situation of the load 60, the DC voltage outputted from the energy converter 21 fails to have a constant value even with respect to the same ambient energy intensity.

In other words, if a constant value of the load is always maintained, the value of the DC voltage outputted from the energy converter 21 is determined in proportion to the intensity of the input ambient energy. Thus, as seen from FIG. 5, the energy converter 21 generates an output DC voltage level in proportion to the amount of the ambient energy inputted with respect to a constant or fixed output load value. That is, when it is necessary to estimate the ambient energy intensity, it is possible to detect the output DC voltage proportional to the intensity of the ambient energy by connecting the output voltage/current detector 40 having a constant load value to the energy converter 21. Then, based on the detected DC voltage, it is possible to estimate the intensity of the ambient energy. In FIG. 5, the horizontal axis represents the input power (dBm, intensity of ambient energy), and the vertical axis represents the output DC voltage (V).

As such, the output voltage/current detector 40 performs a function of maintaining a constant load value. When it is necessary to estimate the intensity of the input ambient energy, connecting the output terminal of the energy converter 21 to the output voltage/current detector 40 allows the output DC voltage to form a constant voltage level corresponding to the constant intensity of the input ambient energy. Therefore, because the output voltage/current detector 40 has a constant load value, it is possible to estimate the intensity of the input ambient energy by detecting the output DC voltage value of the energy converter 21.

Although the above discussion focuses on the reason for detecting the output DC voltage of the energy converter 21 with the output voltage/current detector 40 having a constant load value, the reason for detecting the output DC current of the energy converter 21 is the same as the discussed. That is, the output DC current of the energy converter 21 is proportional to the intensity of the input ambient energy.

Meanwhile, the controller 50 controls the overall operation of the energy harvesting apparatus 10. In particular, by controlling the switch 30, the controller 50 can estimate the intensity of the ambient energy inputted during the energy harvesting.

In order to perform the energy harvesting, the controller 50 connects the energy converter 21 to the energy storage 25 through the switch 30, thus allowing the DC power outputted from the energy converter 21 to be stored in the energy storage 25.

In order to perform the estimation of the ambient energy intensity, the controller 50 switches, using the switch 30, the connection between the energy converter 21 and the energy storage 25 to the connection between the energy converter 21 and the output voltage/current detector 40. Then, the output voltage/current detector 40 detects at least one of the DC voltage and the DC current outputted from the energy converter 21. The controller 50 receives the detected DC voltage and/or the detected DC current from the output voltage/current detector 40 and thereby estimates the intensity of the ambient energy. Then, the controller 50 may transmit the estimated ambient energy intensity to the load 60.

The controller 50 may perform the estimation of the ambient energy intensity periodically or aperiodically. Alternatively or additionally, the controller 50 may estimate the ambient energy intensity at the request of the load 60.

The controller 50 may perform the estimation of the ambient energy intensity after power is charged in the energy storage 25 to a predetermined level or more. That is, in an operable state with a certain charging level of the energy storage 25, the controller 50 may perform the estimating operation of the ambient energy intensity.

Figure 6:
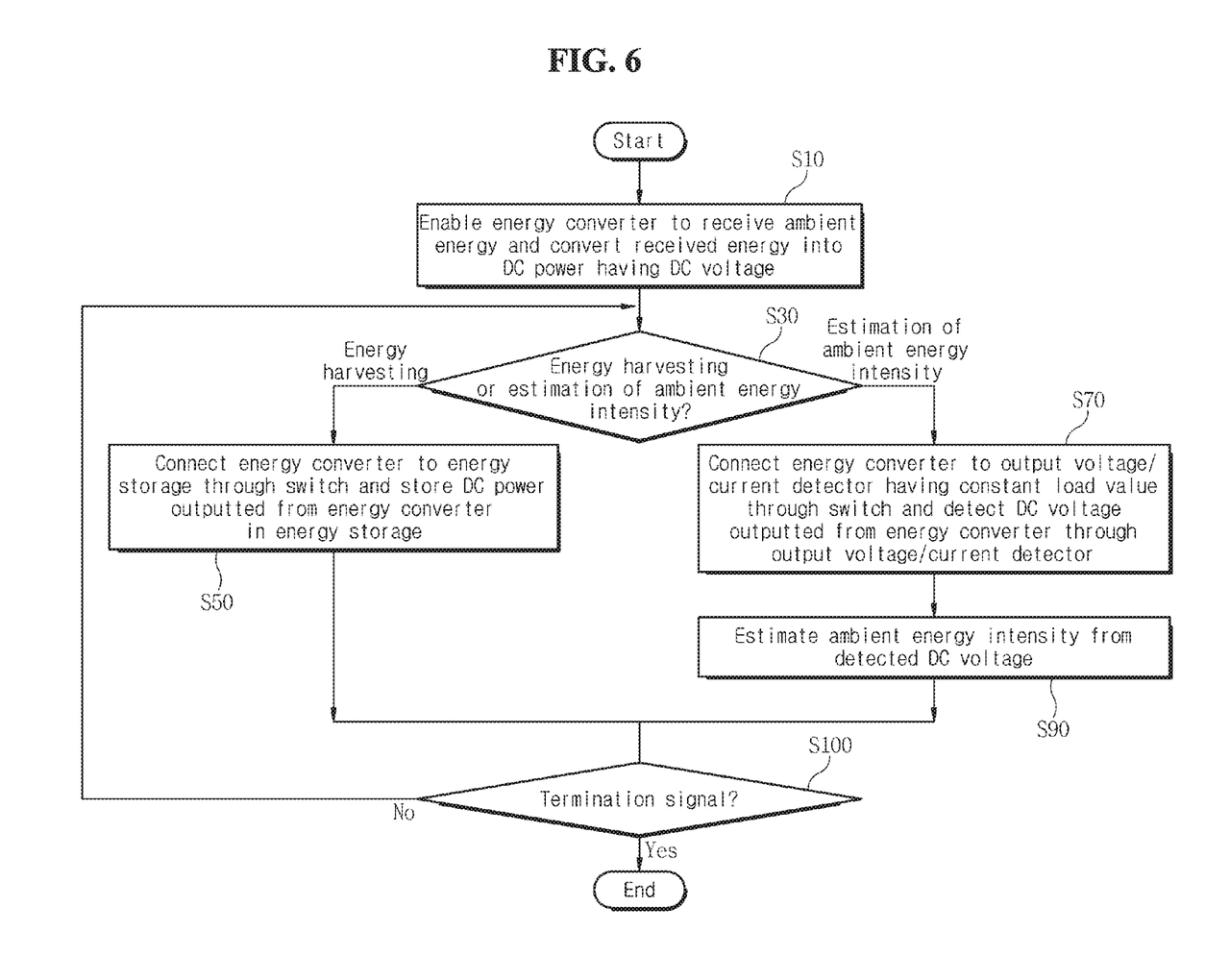
FIG. 6 is a flow diagram illustrating a method for estimating the ambient energy intensity at the energy harvesting apparatus according to the first embodiment of the present disclosure.

Now, a method for estimating the ambient energy intensity, performed by the energy harvesting apparatus 10 according to the first embodiment, will be described with reference to FIG. 6. FIG. 6 is a flow diagram illustrating a method for estimating the ambient energy intensity at the energy harvesting apparatus according to the first embodiment of the present disclosure. In the followings, detecting the DC voltage in order to estimate the ambient energy intensity will be described as an example.

At step S10, the energy harvesting apparatus enables the energy converter to receive ambient energy, convert the received energy into DC power having a DC voltage, and output the DC power.

Next, at step S30, the energy harvesting apparatus determines whether to perform the energy harvesting or the estimation of ambient energy intensity.

When it is determined at the step S30 to perform the energy harvesting, at step S50 the energy harvesting apparatus connects the energy converter to the energy storage through the switch and store the DC power outputted from the energy converter in the energy storage.

When it is determined at the step S30 to perform the estimation of ambient energy intensity, at step S70 the energy harvesting apparatus connects the energy converter to the output voltage/current detector through the switch and detects the DC voltage, outputted from the energy converter, through the output voltage/current detector.

Then, at step S90, the energy harvesting apparatus estimates the intensity of the ambient energy, based on the detected DC voltage.

At step S100, the energy harvesting apparatus determines whether a termination signal is inputted. If there is no input of the termination signal at step S100, the energy harvesting apparatus returns to the step S30.

After the step S90, the energy harvesting apparatus may transmit information about the estimated intensity of ambient energy to the load.

As described above, according to the first embodiment, the energy harvesting apparatus is capable of estimating the intensity of the ambient energy as well as performing the energy harvesting by collecting the ambient energy. Therefore, without requiring an additional sensor for monitoring the ambient energy, it is possible to simply provide information about the intensity of the ambient energy that can be collected from surroundings.

The energy harvesting apparatus according to the first embodiment can detect, using the output voltage/current detector having a constant load value, the DC voltage outputted from the energy converter and then estimate, using the controller, the intensity of the ambient energy from the detected DC voltage. Because the output DC voltage detected on the basis of the constant load value has a property that is proportional to the intensity of the ambient energy inputted to the energy converter, using this property allows the simple estimation of the ambient energy intensity without any additional sensor for the ambient energy monitoring.

In case of the energy harvesting, the amount of power generated by collecting the ambient energy is merely in the level of micro-watt or nano-watt, which is much smaller than typical battery and wired power supply systems. Thus, it is required that the output voltage/current detector 40, the controller 50, or the load 60 in the energy harvesting system 100 is operated with very low power. The ambient energy intensity estimation method according to the first embodiment makes it possible to efficiently estimate the ambient energy intensity through the output DC voltage detection with very low power in the energy harvesting system 100.

Second Embodiment

Although the first embodiment discloses that the energy harvesting apparatus 10 detects the DC voltage outputted from the energy converter 21 through the output voltage/current detector 40 and estimates the ambient energy intensity through the controller 50, the present disclosure is not limited thereto. Alternatively, as shown in FIG. 7, when the energy harvesting apparatus 110 detects at least one of the DC voltage and the DC current outputted from the energy converter 21 through the output voltage/current detector 40, the estimation of the ambient energy intensity, based on the detected DC voltage and/or current, may be performed by the load 160.

Figure 7:
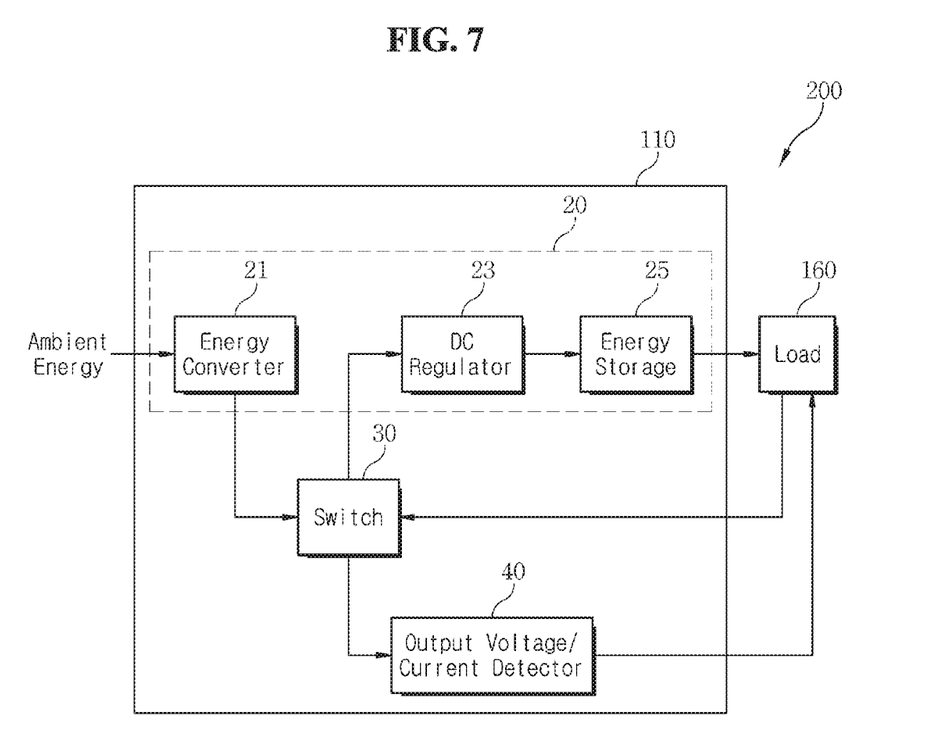
FIG. 7 is a block diagram illustrating an energy harvesting system for estimating ambient energy intensity according to a second embodiment of the present disclosure.

FIG. 7 is a block diagram illustrating an energy harvesting system for estimating ambient energy intensity according to a second embodiment of the present disclosure.

Referring to FIG. 7, an energy harvesting system 200 according to the second embodiment includes an energy harvesting apparatus 110 and a load 160. The energy harvesting apparatus 110 collects ambient energy, generates DC power, and detects at least one of a DC voltage and a DC current of the DC power. The load 160 operates by receiving the DC power from the energy harvesting apparatus 110, controls the operation of the energy harvesting apparatus 110, and estimates the intensity of the ambient energy by receiving the detected DC voltage and/or current from the energy harvesting apparatus 110.

The energy harvesting apparatus 110 according to the second embodiment includes the energy harvester 20, the switch 30, and the output voltage/current detector 40. The energy harvester 20 includes the energy converter 21 and the energy storage 25, and may further include the DC regulator 23.

Except for including no controller, the energy harvesting apparatus 110 of the second embodiment is the same as the energy harvesting apparatus 10 of the first embodiment. Therefore, descriptions of the same components and functions will be omitted.

The load 160 controls the overall operation of the energy harvesting apparatus 110. In particular, by controlling the switch 30, the load 160 estimates the intensity of the ambient energy inputted during the energy harvesting That is, in the second embodiment, the load 160 can perform a function of the controller according to the first embodiment.

In order to perform the energy harvesting, the load 160 controls the switch 30 to connect the energy converter 21 to the energy storage 25, thus allowing the DC power outputted from the energy converter 21 to be stored in the energy storage 25.

In order to perform the estimation of the ambient energy intensity, the load 160 controls the switch 30 to switch the connection between the energy converter 21 and the energy storage 25 to the connection between the energy converter 21 and the output voltage/current detector 40. Then, the output voltage/current detector 40 detects at least one of the DC voltage and the DC current outputted from the energy converter 21. The load 160 receives the detected DC voltage and/or the detected DC current from the output voltage/current detector 40 and thereby estimates the intensity of the ambient energy.

The load 160 may perform the estimation of the ambient energy intensity periodically or aperiodically.

The load 160 may perform the estimation of the ambient energy intensity after power is charged in the energy storage 25 to a predetermined level or more. That is, in an operable state with a certain charging level of the energy storage 25, the load 160 may perform the estimating operation of the ambient energy intensity.

Figure 8:
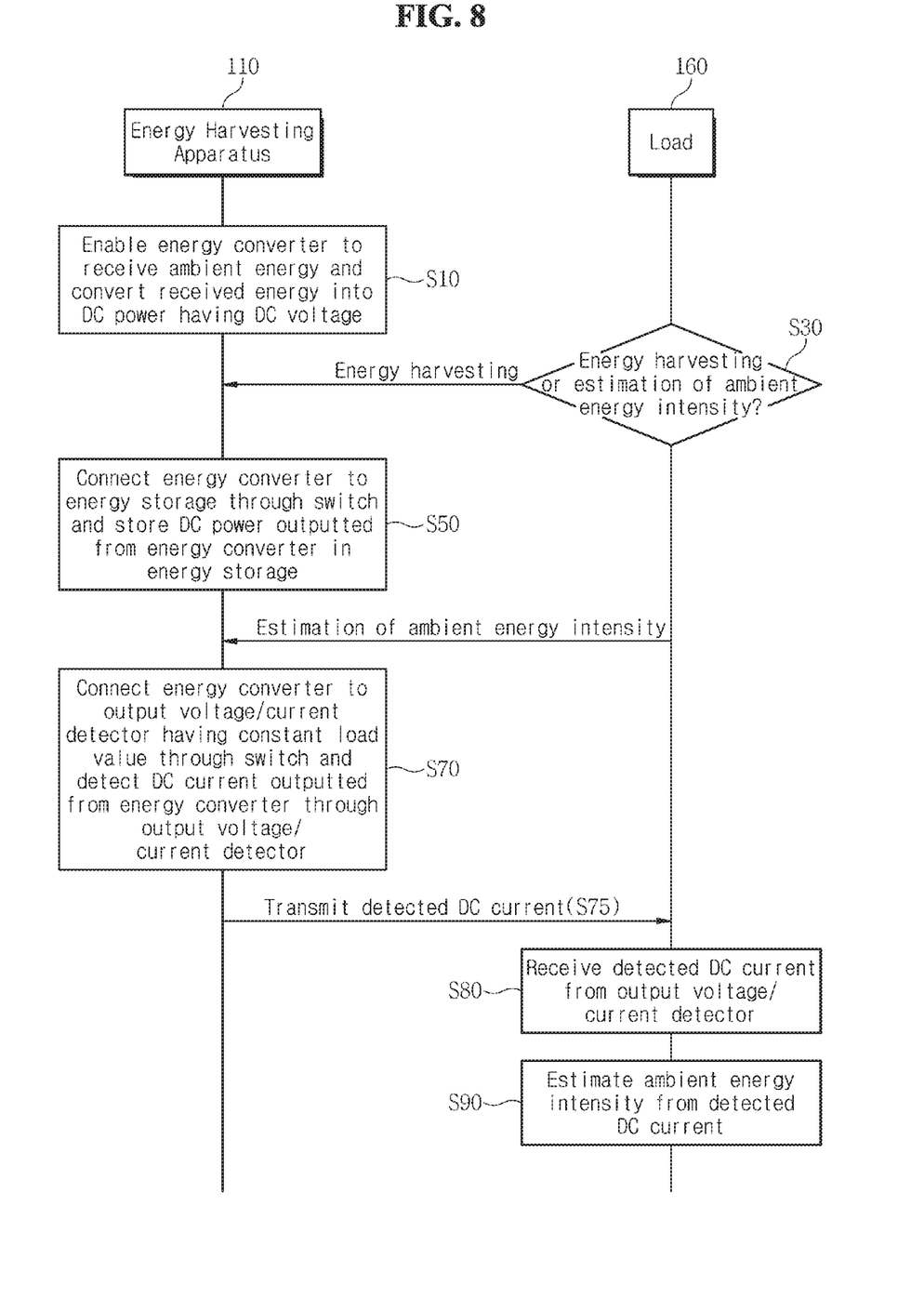
FIG. 8 is a flow diagram illustrating a method for estimating the ambient energy intensity at the energy harvesting system according to the second embodiment of the present disclosure.

Now, a method for estimating the ambient energy intensity, performed by the load 160 according to the second embodiment, will be described with reference to FIG. 8. FIG. 8 is a flow diagram illustrating a method for estimating the ambient energy intensity at the energy harvesting system according to the second embodiment of the present disclosure. In the followings, detecting the DC current in order to estimate the ambient energy intensity will be described as an example.

At step S10, the energy harvesting apparatus 110 enables the energy converter to receive ambient energy, convert the received energy into DC power having a DC current, and output the DC power.

Next, at step S30, the load 160 determines whether to perform the energy harvesting or the estimation of ambient energy intensity.

When it is determined at the step S30 to perform the energy harvesting, at step S50 the load 160 controls the switch of the energy harvesting apparatus 110 to connect the energy converter to the energy storage so that the energy storage stores the DC power outputted from the energy converter.

When it is determined at the step S30 to perform the estimation of ambient energy intensity, at step S70 the load 160 controls the switch of the energy harvesting apparatus 110 to connect the energy converter to the output voltage/current detector so that the output voltage/current detector detects the DC current outputted from the energy converter.

Then, at step S75, the output voltage/current detector of the energy harvesting apparatus 110 transmits the detected DC current to the load 160.

At step S80, the load 160 receives the detected DC current from the output voltage/current detector of the energy harvesting apparatus 110.

Then, at step S90, the load 160 estimates the intensity of the ambient energy, based on the detected DC current.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A method for estimating ambient energy intensity, performed by a load in an energy harvesting system including the load and an energy harvesting apparatus composed of an energy converter, a switch, an energy storage, and an output voltage/current detector having a constant load value, the method comprising:
   in case of energy harvesting, controlling, by the load, the switch to connect the energy converter to the energy storage such that DC power outputted from the energy converter is stored in the energy storage;
   in case of the estimating intensity of the ambient energy, controlling, by the load, the switch to disconnect the energy converter from the energy storage and connect the energy converter to the output voltage/current detector through the switch such that the output voltage/current detector detects at least one of a DC voltage and a DC current outputted from the energy converter;
   receiving, by the load, at least one of the detected DC voltage and the detected DC current from the output voltage/current detector; and
   estimating, by the load, the intensity of the ambient energy from at least one of the received DC voltage and the received DC current.

2. The method of claim 1, wherein the DC voltage and the DC current, detected based on the constant load value, are proportional to the intensity of the ambient energy.

3. An energy harvesting system comprising:
   an energy harvesting apparatus configured to collect ambient energy, generate DC power from the ambient energy, and detect at least one of a DC voltage and a DC current of the DC power; and
   a load configured to operate by receiving the DC power from the energy harvesting apparatus,
   wherein the energy harvesting apparatus includes:
      an energy converter configured to receive the ambient energy, convert the ambient energy into the DC power having the DC voltage and the DC current, and output the DC power;
      an energy storage configured to receive and store the DC power;
      an output voltage/current detector having a constant load value and configured to detect at least one of the DC voltage and the DC current, outputted from the energy converter, to be used for estimating intensity of the ambient energy; and
      a switch connected with the energy converter, the energy storage, and the output voltage/current detector, and configured to selectively connect the energy converter to the energy storage or the output voltage/current detector, wherein the load is configured to control the switch to connect the energy converter to the output voltage/current detector, receive at least one of the detected DC voltage and the detected DC current from the output voltage/current detector, and estimate the intensity of the ambient energy from at least one of the received DC voltage and the received DC current.

4. The energy harvesting system of claim 3, wherein the energy harvesting apparatus further includes:
a DC regulator interposed between the switch and the energy storage, and configured to convert the DC voltage, outputted from the energy converter, into a DC voltage to be usable in a load.

5. The energy harvesting system of claim 3, wherein the load includes an Internet of Things (IoT) device.

* * * * *